(12) United States Patent
Dorr et al.

(10) Patent No.: US 8,575,942 B2
(45) Date of Patent: Nov. 5, 2013

(54) NON-CONTACTING METHOD AND APPARATUS FOR DETERMINING CONTACT VOLTAGE SOURCES AND PROVIDING A WARNING FOR SAME

(75) Inventors: Douglas Stewart Dorr, Tavares, FL (US); Kermit O. Phipps, Harriman, TN (US); Thomas A. Cooke, Maynardville, TN (US); Philip C. Cochrane, Maryville, TN (US)

(73) Assignee: Electric Power Research Institute, Inc., Charlotte, NC (US)

( * ) Notice: Subject to any disclaimer, the term of this patent is extended or adjusted under 35 U.S.C. 154(b) by 364 days.

(21) Appl. No.: 12/908,031

(22) Filed: Oct. 20, 2010

(65) Prior Publication Data
US 2011/0156723 A1 Jun. 30, 2011

Related U.S. Application Data

(60) Provisional application No. 61/291,090, filed on Dec. 30, 2009.

(51) Int. Cl.
*G01R 31/08* (2006.01)

(52) U.S. Cl.
USPC ............. 324/522; 324/656; 324/72; 324/457; 324/326; 361/80

(58) Field of Classification Search
USPC .................................................. 324/656, 72
See application file for complete search history.

(56) References Cited

U.S. PATENT DOCUMENTS

| | | | | |
|---|---|---|---|---|
| 4,272,719 A * | 6/1981 | Niki et al. | ......................... | 324/72 |
| 4,277,745 A * | 7/1981 | Deno | .............................. | 324/72 |
| 5,831,538 A * | 11/1998 | Schena | ......................... | 340/635 |
| 6,329,924 B1 * | 12/2001 | McNulty | ........................ | 340/660 |
| 2002/0097056 A1 * | 7/2002 | Blades | ........................... | 324/536 |
| 2003/0181177 A1 * | 9/2003 | Katagiri | ...................... | 455/188.2 |
| 2004/0227517 A1 * | 11/2004 | Mizuno | ........................ | 324/326 |
| 2006/0071669 A1 * | 4/2006 | Funato et al. | .................. | 324/632 |
| 2007/0279067 A1 * | 12/2007 | Wiswell et al. | ............... | 324/457 |
| 2008/0122424 A1 * | 5/2008 | Zhang et al. | ..................... | 324/72 |
| 2008/0204034 A1 * | 8/2008 | Blades | ........................... | 324/522 |
| 2009/0195255 A1 * | 8/2009 | Kalokitis et al. | .............. | 324/522 |

* cited by examiner

*Primary Examiner* — Melissa Koval
*Assistant Examiner* — Benjamin M Baldridge
(74) *Attorney, Agent, or Firm* — Trego, Hines & Ladenheim, PLLC

(57) ABSTRACT

This invention relates to non-contact measurement methods and an apparatus for the identification of hazardous contact voltages on energized objects and surfaces. The apparatus includes an electric field sensor structured to sense an electric field and a gain amplifier electrically connected to the electric field sensor to amplify electric signals from the electric field sensor. The apparatus further includes a signal conditioning circuit adapted to process the amplified electric signals and form time-coordinated signals and a digital signal processor adapted to evaluate the time-coordinated signals and provide a user with a status of a contact voltage source by activating an appropriate status indicator.

18 Claims, 2 Drawing Sheets

NON-CONTACTING METHOD AND APPARATUS FOR DETERMINING CONTACT VOLTAGE SOURCES AND PROVIDING A WARNING FOR SAME

This application claims the benefit of Provisional Application No. 61/291,090 filed on Dec. 30, 2009.

BACKGROUND OF THE INVENTION

The present invention relates generally to non-contact measurement methods and an apparatus for the identification of hazardous contact voltages on energized objects and surfaces proximate to electric power sources or conductors.

Each year, many animals and people suffer "electric shocks" on energized metallic objects from several sources of electric potential. Some of these "electric shocks" have previously proven to be lethal to both animals and people. Electric utilities are responsible for the distribution and transmission of electric power to homes and businesses and hence have been found responsible to identify and mitigate these potentially lethal voltage sources. Previously some devices have been available to provide a warning, but with higher than wanted "false positive" warnings. The false warnings take valuable manpower away from the identification and mitigation of truly life threatening voltage points.

During a typical utility company evaluation of a "shock" complaint about contact voltage, the investigator must be cognizant of the fact that the source of the shock is initially undefined but could be caused by many possible sources. As the voltage magnitude is unknown, the investigator must not contact the source for safety reasons. These contact points encompass a variety of voltage and current sources and include but are not limited to faulted electrical equipment, such as motors, water heaters, and so on where the breaker has not opened; inadvertent energization of a conductive object, such as service boxes, streetlights, manholes, etc; electric field coupling such as the electric field from an overhead power line coupling voltage to a metal casing of a streetlight or other conductive object proximate to the electric field; neutral conductor voltage drop, such as current flow through neutral resistance or the I×R drop; harmonic resonance, such as power system currents interacting with the circuit elements where the harmonic voltages are related to the power line frequency; and magnetic induction, such as current on a power line conductor inducing voltage on a parallel pipeline, fence, or conductor proximate to the power line conductor.

While only the first two of the enumerated conditions warrant immediate attention, initial evaluation precautions assume that an electric shock hazard is present unless metering equipment provides an indication via measured voltage levels that it is not an electric shock hazard. If an electrical hazard is present, it is important to secure the area with warning or caution barriers such that humans and animals are unlikely to contact the energized object(s) until they can be de-energized and repaired.

The second precaution is to consider that the level of voltage present either on an energized object or at a neutral-to-ground bonding point will vary with season, circuit loading, intermittent contact of a faulted conductor, and in some reports, the photo sensors in street lighting systems. When a shock complaint is received, there is a chance that no contact voltage situations will be found on the first try, so the complaint area may require a more thorough investigation to determine the possibility of an intermittent problem.

BRIEF SUMMARY OF THE INVENTION

Accordingly, there is a need for a non-contact method and apparatus to detect and warn of a contact voltage.

These and other shortcomings of the prior art are addressed by the present invention, which provides an improved non-contact method and apparatus for contact voltage detection and warning. The improved apparatus provides a very high confidence level of problematic contact voltage sources so as to perform a warning of potentially hazardous voltages on energized objects or other conductive surfaces. At the same time the apparatus serves to decrease the number of false or erroneous warnings. The specific concept is to detect the electric field (E) emanating from the energized object or surface and perform digital and analog signal processing of the subject electric field (E) signal to compare the frequency spectra of the subject electric field (E) signal to a spectra of known energization source types and to provide a suitable source indication when that source is identifiable.

In one preferred embodiment, the apparatus is configured such that it is a hand held device for contact voltage detection, identification, and warning by ground personnel. Mobile configurations may also be implemented.

In another embodiment, the apparatus may be equipped with suitable high voltage insulated probes allowing a direct contact to the surface or object to be measured.

In another embodiment, the apparatus provides a non-contacting measurement and detection method without shock risk to personnel operating the apparatus.

In another embodiment, the method includes the detection of a contact voltage source, enhancement by signal processing techniques of the detected signal from the contact voltage source, and reporting of the type of contact voltage source via use of enunciator LED indicators.

In another embodiment, the contact voltage detection method provides a method to receive an electric field signal from an unknown electric field source in a range of 0.5 volts per meter to 10 volts per meter from an electric field sensor such that the electric field sensor construction is omni-directional and has an effective surface area of 5 centimeters squared. The electric field sensor may be a coil on a ferrite core such that the sensor is particularly sensitive to low frequency AC electric fields.

In another embodiment of the invention, the method includes amplifying the AC electric field signal generated by the electric field sensor, changing the low frequency AC signal into a DC signal by means of a detector, and processing the DC signal via an anti-logarithmic amplifier to give an electric field strength indication of the sensed AC electric field.

In another embodiment, concurrently, the method provides signal conditioning of the amplified AC electric field, and the method of using specific filtering techniques to form three distinct signals.

In another embodiment of the invention, the method includes forming a first signal, a third derivative of the amplified AC electric field signal; forming a second signal, a comparison of the fundamental frequency as compared to the third harmonic of the fundamental frequency; and forming a third signal by generation of a signal representing the total harmonic distortion of the fundamental frequency.

In another embodiment, analog or digital filtering techniques may be used to generate the three signals as described.

In another embodiment, the third derivative is chosen to allow the lowest order derivative while maintaining the phase relationship to the fundamental sine wave (ie. f0'''=−COS). The inverted cosine waveform is trigonometrically a sine waveform.

In another embodiment of the invention, in the derivative, small non-sinusoidal magnitude changes in the fundamental sine waveform are enhanced while the relative magnitude of the original sine waveform is constant. This enhancement method is a portion of the total signal enhancement in the signal conditioning stage of the invention. While higher order derivatives are possible, the third derivative is chosen as it has one of the least complex forms to implement in either the analog circuitry or digital signal processing techniques.

In yet another embodiment of the invention, the method includes comparing the three time coordinated signals as described above in a digital signal processor to evaluate the state of the three signals and determine the characteristics of a faulted power frequency contact voltage, a neutral-earth (NEV) contact voltage, an intermittent arcing condition fault, or an induced "float" contact voltage.

In yet another embodiment, the method includes enunciating the characteristic via LED to produce an indication of contact voltage hazard.

BRIEF DESCRIPTION OF THE DRAWINGS

The subject matter that is regarded as the invention may be best understood by reference to the following description taken in conjunction with the accompanying drawing figures in which.

DETAILED DESCRIPTION OF THE INVENTION

Figure 1:
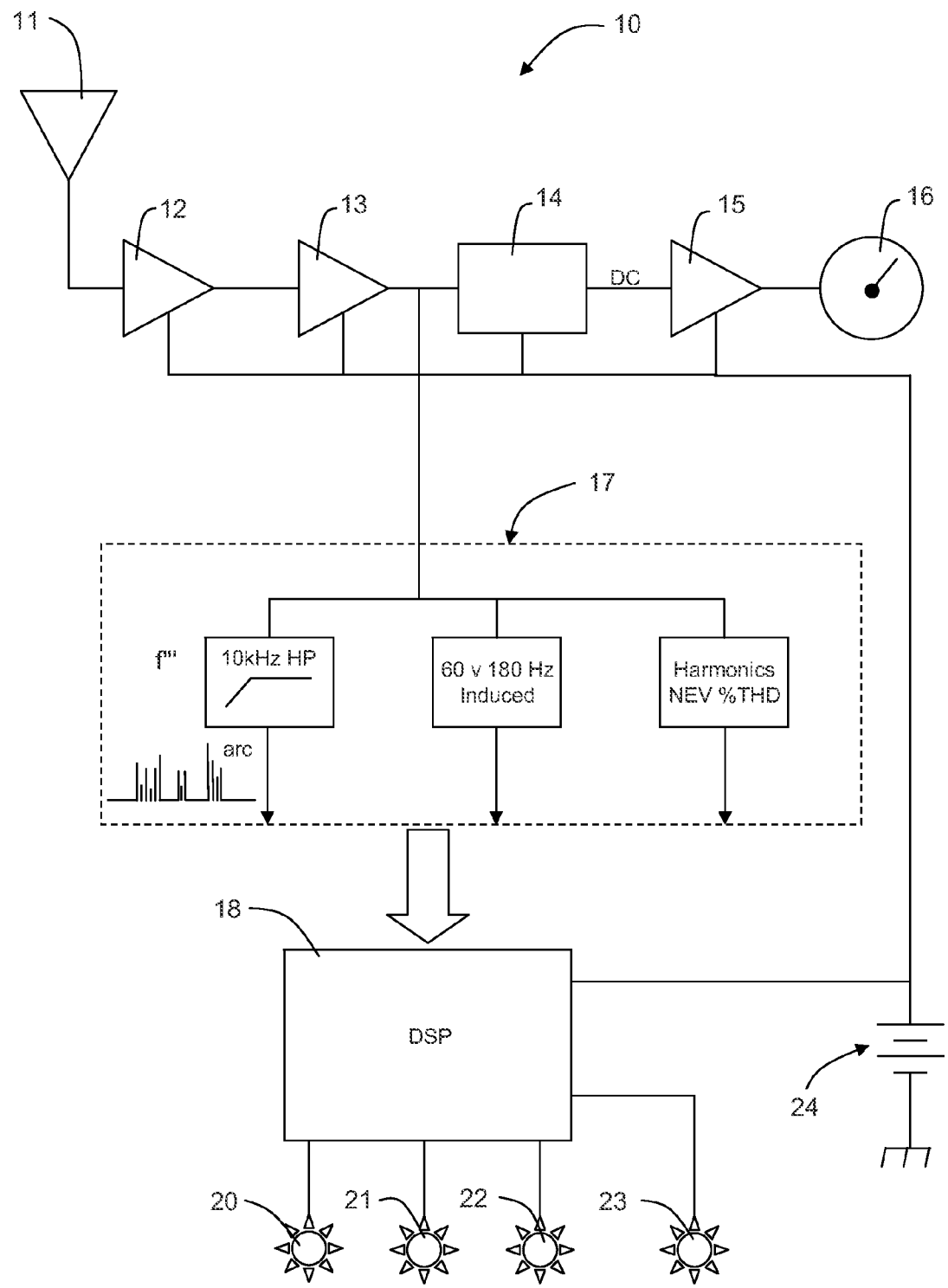
FIG. 1 is a block diagram in schematic form of a contact voltage source detection apparatus.

In evaluating a contact voltage for remediation, it is important (once a measurable voltage has been identified) to understand the source of the energization. When attempting to determine the cause of a voltage detection or a shock complaint, it is very useful to have some theoretical insights into the characteristics of what might be measured from different energization sources.

The concepts of fundamental frequency (f0), harmonic frequencies (H1, 2, 3, 4 . . . n) of the fundamental frequency (f0), the voltage source, and the current source, are well-known and useful in understanding why the contact voltage waveforms for certain conditions can be significantly different.

A voltage source is one where the actual power generation source (transformers, gensets, UPS etc.) supplies the measured voltage. These types of voltage sources include load and line faults as well as electric field coupling. Unlike the voltage source, which is available at the contact point anytime that a circuit is energized, the current source requires that current is flowing in a circuit in order to develop a voltage potential at a contact location. A current source, as defined in context of this discussion, is the voltage that is generated only when load currents are flowing (such as voltage drop on a conductor or magnetically induced voltage onto a parallel object or conductor).

A practical example of a voltage source is the AC phase (hot) conductor when it is faulted to an energized object. In this case, the voltage on the phase conductor is coupled to the energized object either directly or through the soil. If it is directly coupled, then the entire source voltage may be impressed on the object, but if it is coupled through a soil resistance, then only a portion of the phase voltage will be impressed on the object when measured with a load resistor. Either way, there is a need to quickly locate and remediate the source of the energization.

Example characteristics of contact voltages due to faults include: (1) the voltage from the source transformer and the voltage measured at the contact voltage location are exactly the same in waveform and spectral content; (2) if there is any harmonic content, it will be nearly identical to that present on the source transformer (generally just one to three percent total harmonic distortion, THD) rarely exceeding 5% THD and never exceeding 10% THD; and (3) there may or may not be current flow during the fault condition, but the voltage should be measureable in either case.

Electric fields (E) emanate from charged conductors and objects anytime that they are energized. As opposed to the magnetic field (H), which requires current flow, the electric field is always present on an energized conductor. Characteristics of this type of contact voltage include: (1) the electric field (E) is generally not a concern except at transmission-class voltage levels of 69 kV and higher; and (2) the electric field (E) is capacitively coupled to conductive objects such as metal roofs on buildings, pipelines, fences, light poles, and so on. Unlike the magnetic field (H), which varies in intensity, the electric field (E) tends to remain fairly constant over time. This provides a useful way to distinguish between electric and magnetic field sources, even though the voltage waveforms can look similar in some situations.

An example of a current source is the voltage drop created on a neutral conductor when AC current flows through the impedance (resistance) of the conductor. Most electrical codes allow for about a 3% voltage drop on a single-phase electrical circuit. It follows that half of that three percent would be on the neutral conductor, while the other half of the drop is on the phase conductor. This means that the expected voltage drop on a typical neutral conductor is going to be 1.5% or just under 2 volts when the circuit is fully loaded.

Characteristics of neutral-earth (NEV) type of contact voltage include: (1) the voltage measured at the contact location will look exactly like the load current (which is the current source)—the contact voltage will only be sinusoidal if the load current is sinusoidal, whereas the voltage drop will be high in harmonic content if the load current is high in harmonic content; (2) the only time one would expect to see a sinusoidal waveform from a neutral current source would be if the load were either a motor (pump, fan, and so on), a heater, or an incandescent light bulb—nearly all other loads would create some amount of harmonics (typically greater than 10% THD); (3) unlike the fault condition where the voltage should remain fairly constant unless the weather changes for wet to dry or vise versa, the neutral voltage drop measurement will go up and down as the current on the circuit goes up and down.

Electromagnetic fields are present any time that there is AC current flowing through a circuit conductor. As such, the magnetic field (H) will couple onto any conductive objects in parallel with the conductor generating the magnetic field (magnetic induction). Common situations where an object becomes energized include buried water and gas lines as well as fences and railroad tracks proximate to the power line conductor.

Characteristics of this type of contact voltage include: (1) the magnetic field will couple onto conductive objects in parallel with the current-carrying conductors, impressing a voltage onto the object that looks exactly like the current on the neutral conductor; and (2) while it would follow that the neutral-to-earth voltage at any of the pole down grounds would have a similar waveform (but different magnitude), they should be electrically out of phase with one another by ninety degrees.

Depending on grounding of the neutral and the grounding condition of the pipeline, as well as the possibility to have combined electric field coupling, magnetic induction, and even earth current conduction, the NEV and the pipeline-to-earth voltage waveforms may or may not look identical on a scope meter The harmonic resonance concern is generally another form of neutral conductor voltage drop. The distinction is that the voltage drop can become more severe than normal, due to the resonant condition. This scenario is most commonly associated with three-phase wye-grounded power distribution systems with distributed power-factor-correction capacitor banks. Characteristics of this type of contact voltage include: (1) the harmonic current magnitudes and the harmonic NEV tend to become a larger percentage of the total as the measurements are taken closer to the substation; (2) taking all of the circuit capacitor banks off line will tend to minimize the harmonic NEV, but not significantly change the amount of fundamental frequency (60-Hz typical) NEV; and (3) the harmonic NEV levels will vary with circuit loading.

Based on the above, four key conclusions may be drawn: (1) if a contact voltage waveform as measured is a 60 Hz sinusoidal wave shape with less than 10% voltage total harmonic distortion (Vthd), it is most likely due to a faulted phase conductor—the only exception to this conclusion is when the voltage electric field has been coupled to an object or when the circuit return (neutral) current is predominantly sinusoidal from loads having sinusoidal currents such as incandescent lights, heaters and motors; (2) if a contact voltage waveform contains greater than 10% voltage total harmonic distortion (Vthd), the source is more than likely due to either grounded return path (neutral) voltage drop or is due to magnetic induction—the only exceptions to this case would be a source with high THD such as a genset or an overloaded UPS, or an unusual circuit resonance condition; (3) for induced contact voltage sources, the total harmonic distortion (% THD) is a function of the currents flowing on all parallel conductors, therefore the waveshape is not easily predictable, but the voltage will vary with circuit load level; and (4) for electric field coupled voltage sources, the voltage will typically be identical in spectral content to the source but should not vary with circuit loading.

Referring to FIG. 1, a contact voltage source detection apparatus according to an embodiment of the invention is shown generally at 10. The apparatus 10 may be a hand held apparatus or any other suitable mobile apparatus. The apparatus 10 includes an electric field sensor 11 structured to sense an electric field (E) in series connection to an impedance matching buffer amplifier circuit 12 to match the output impedance of sensor 11 and to provide a low impedance output to an input of gain amplifier 13. The gain amplifier 13 is connected in series with the buffer amplifier circuit 12 to boost electric signals from the electric field sensor 11.

An output of gain amplifier 13 is connected to both a detector circuit 14 and a signal conditioning circuit 17. The detector circuit 4 is connected in series to the gain amplifier 13 to change the AC electric field signals to a DC representation of the electric field. An output of the detector circuit 14 is series connected to an anti-logarithmic amplifier 15, which is series connected to a field strength indicator 16, to limit the signal from the detector so as to give a log response and provide an indication of relative electric field strength. The anti-logarithmic response of the field strength meter 16 serves to help locate the contact voltage source as the apparatus 10 is swept in an area containing a contact voltage source.

The signal conditioning circuit 17 processes the AC electric field signal and, may contain analog elements, digital signal processing elements, or both to perform the aspect of conditioning the signal representing the electric field (E) for digital processing. The signal conditioning circuit 17 is an anti-logarithmic amplifier to normalize relative field strength readings as the unit is moved closer in proximity to the contact voltage source and may be used to drive a field strength meter or indicator to provide an indication of relative electric field strength.

The signal conditioning circuit 17 simultaneously forms three time coordinated signals. The signals represent (1) a third derivative signal (f0''') of the fundamental frequency (f0) by analog or digital signal processing techniques, (2) a magnitude comparison signal comparing the ratio (H3/f0) of the relative fundamental frequency (f0) magnitude to the third harmonic frequency (H3) magnitude of the fundamental frequency (f0) by analog or digital signal processing techniques, and (3) a signal formed from the total harmonic distortion (% THD) of the fundamental frequency (f0) by analog or digital signal processing techniques. The time coordinated signals of the third derivative signal (f0'''), the third harmonic ratio (H3/f0) signal, and the total harmonic distortion (% THD) signal are accomplished by digital signal processing techniques to time align the data from the three signals. The three signals from the signal conditioning circuit 17 are connected to a digital signal processor 8.

The digital signal processor 18 further performs the task of evaluating the status of the three conditions and provides a reporting function to illuminate an appropriate status indicator, LEDs 20, 21, 22, 23. The digital signal processor 18 functions to make a time-coordinated comparison of the states of the three signals from the signal conditioning circuit 17 and based on the status of the three signals resolves the following 4 states: (1) fundamental direct contact source, LED 20, (2) NEV contact source, LED 21, (3) arcing contact source, LED 23, and (4) third harmonic induced contact source, LED 22. In response, the digital signal processor 18 illuminates the LEDs 20, 21, 22, and 23 to enunciate the resolved 4 states. A battery or rechargeable battery 24 provides power to operate the apparatus 10.

Figure 2:
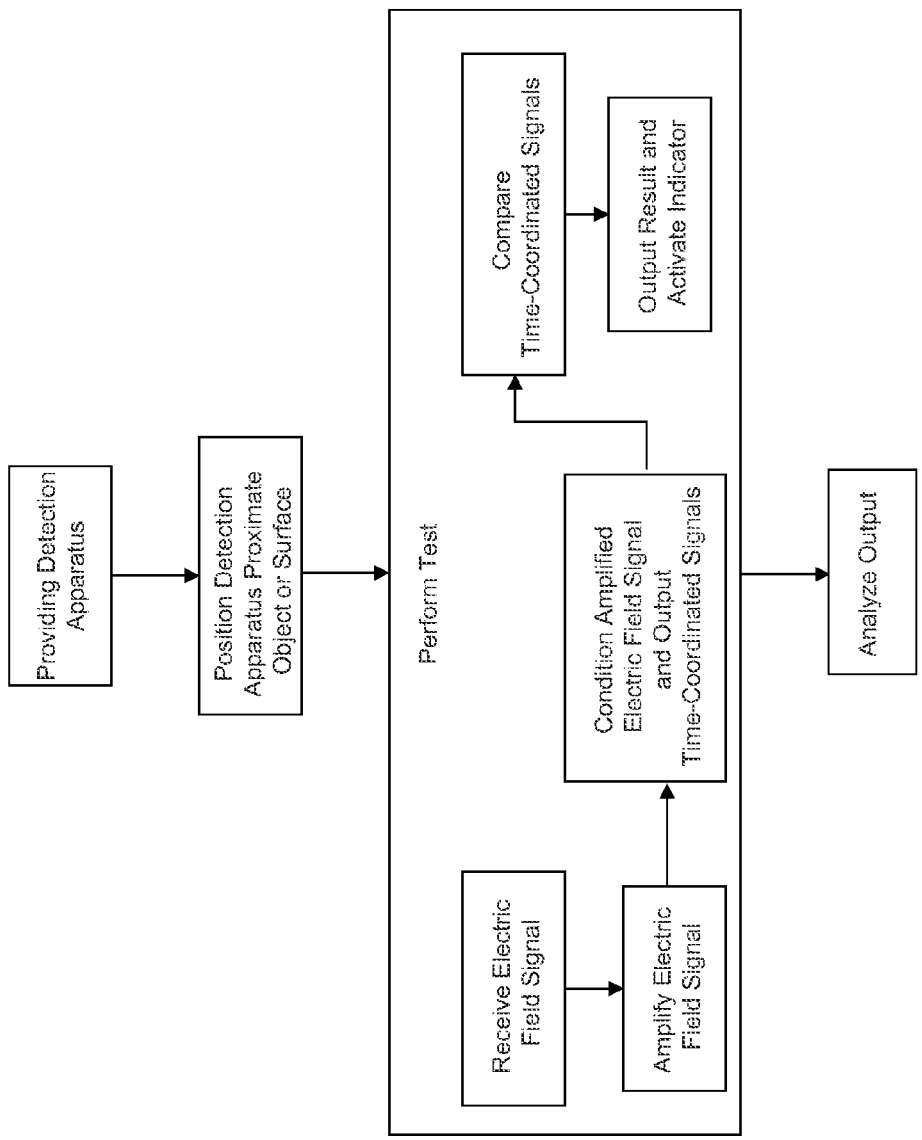
FIG. 2 is a block diagram showing a method of detecting a hazardous contact voltage.

In use, FIG. 2, the apparatus 10 is positioned proximate to and in non-contacting relation to a potentially energized object or surface. The apparatus 10 detects a low frequency AC electric field using the electric field sensor 11, amplifies the AC electric field sensor output using the gain amplifier 13, converts the AC electric field signal to a DC representation of the electric field using the detector circuit 14, uses the anti-logarithmic amplifier 15 to provide a representation of the relative electric field strength, and displays an indication of the relative field strength on an analog or digital field strength indicator 16.

The signal conditioning circuit 17 processes the amplified AC electric field from the gain amplifier 13 and forms the third derivative (f0''') signal of the amplified AC electric field signal, the third harmonic frequency (magnitude) to fundamental frequency (magnitude) comparison signal (H3/f0) from the amplified AC electric field signal, and the signal formed from the signal representing the percent total harmonic distortion (% THD) of the fundamental frequency of the amplified AC electric field signal.

The signal conditioning circuit 17 further compares the time coordinated status of the three signals to determine the contact voltage source status. In particular, a faulted power frequency contact voltage source, a neutral-earth (NEV) contact voltage source, an intermittent arcing condition fault source, or an induced "float" contact voltage source.

The digital signal processor 18 evaluates the time coordinated signals using digital signal processing techniques to determine if the contact voltage source presented faulted condition hazard requiring immediate action, the contact voltage source presented a NEV hazard requiring more evaluation, the contact voltage source presented an arcing hazard requiring immediate action, or a contact voltage source presenting no hazard and requiring no attention.

Once the evaluation is performed, the digital signal processor 18 enunciates the status of the evaluation using LEDs 20-23 to display the states of: fundamental direct contact source, LED 20, NEV contact source, LED 21, arcing contact source, LED 23, and third harmonic induced contact source, LED 22.

The foregoing has described non-contact measurement methods and an apparatus for the identification of hazardous contact voltages on energized objects and surfaces proximate to electric power sources or conductors. While specific embodiments of the present invention have been described, it will be apparent to those skilled in the art that various modifications thereto can be made without departing from the spirit and scope of the invention. Accordingly, the foregoing description of the preferred embodiment of the invention and the best mode for practicing the invention are provided for the purpose of illustration only and not for the purpose of limitation.

We claim:

1. A hand held contact voltage source detection apparatus for identification of hazardous contact voltages on energized objects or surfaces, comprising:
   (a) an electric field sensor structured to sense an electric field;
   (b) an amplifier electrically connected to the electric field sensor to amplify electric signals from the electric field sensor;
   (c) a signal conditioning circuit adapted to process the amplified electric signals and form time-coordinated signals, wherein the time-coordinated signals formed by the signal conditioning circuit are a third derivative (f0''') signal of the amplified electric field signal, a third harmonic frequency to fundamental frequency comparison signal (H3/f0) from the amplified electric field signal, and a signal formed from the signal representing the percent total harmonic distortion (% THD) of the fundamental frequency of the amplified electric field signal; and
   (d) a signal processor adapted to evaluate the time-coordinated signals and provide a user with a status of a contact voltage source by activating an appropriate status indicator.

2. The apparatus according to claim 1, further including an impedance matching buffer amplifier circuit connected in series to the electric field sensor to match the output impedance of the electric field sensor.

3. The apparatus according to claim 2, wherein the amplifier is connected in series with the impedance matching buffer amplifier circuit and receives a low impedance output from the impedance matching buffer amplifier circuit.

4. The apparatus according to claim 1, wherein an output of the amplifier is electrically connected to both a detector circuit and a signal conditioning circuit.

5. The apparatus according to claim 4, wherein the detector circuit is connected in series to the amplifier and is adapted to change the AC electric field signals to a DC representation of the electric field.

6. The apparatus according to claim 4, wherein an output of the detector circuit is connected in series to an anti-logarithmic amplifier, the anti-logarithmic amplifier being connected in series to a field strength indicator to limit the signal from the detector and provide an indication of relative electric field strength.

7. The apparatus according to claim 1, wherein the signal conditioning circuit simultaneously forms three time coordinated signals.

8. The apparatus according to claim 1, wherein the electric field sensor detects a low frequency AC electric field.

9. The apparatus according to claim 1, wherein the signal conditioning circuit further compares a time-coordinated status of the time-coordinated signals to determine a contact voltage source status.

10. The apparatus according to claim 9, wherein the contact voltage source status is selected from the group consisting of a faulted power frequency contact voltage source, a neutral-earth (NEV) contact voltage source, an intermittent arcing condition fault source, and an induced contact voltage source.

11. The apparatus according to claim 1, wherein the signal processor evaluates the time-coordinated signals to determine if the contact voltage source presented a faulted condition hazard requiring immediate action, the contact voltage source presented a neutral-earth (NEV) hazard requiring more evaluation, the contact voltage source presented an arcing hazard requiring immediate action, or a contact voltage source presented no hazard requiring no attention.

12. A method of detecting a hazardous contact voltage on energized objects or surfaces comprising the steps of:
   (a) providing a hand held contact voltage source detection apparatus, having:
      (i) an electric field sensor;
      (ii) an amplifier;
      (iii) a signal conditioning circuit; and
      (iv) a digital signal processor;
   (b) receiving an electric field signal using the electric field sensor;
   (c) amplifying the electric field signal using the amplifier;
   (d) conditioning the amplified signal using the signal conditioning circuit and forming time-coordinated, distinct source type identifier signals;
   (e) comparing the time-coordinated signals using the signal processor to evaluate a state of the time-coordinated signals and determine if a hazardous contact voltage is present; and
   (f) activating an indicator on the handheld contact voltage source detection apparatus that provides a user with a source type identification of the detected contact voltage.

13. The method according to claim 12, wherein the electric field signal is an AC signal.

14. The method according to claim 13, further including the step of converting the AC signal to a DC signal using a detector circuit.

15. The method according to claim 14, further including the step of processing the DC signal using an anti-logarithmic amplifier to provide an electric field strength indication of the AC signal.

16. The method according to claim 12, wherein the digital signal processor evaluates the time-coordinated signals and activates an indicator to provide a user with a source type identification of a contact voltage selected from the group consisting of a faulted power frequency contact voltage, a neutral-earth (NEV) contact voltage, an intermittent arcing condition fault, and an induced contact voltage.

17. The method according to claim 12, further including the step of positioning the detection apparatus proximate to and in non-contacting relation to a potentially energized object or surface.

18. A hand held contact voltage source detection apparatus for identification of hazardous contact voltages on energized objects or surfaces, comprising:

(a) an electric field sensor structured to sense an electric field;
(b) an amplifier electrically connected to the electric field sensor to amplify electric signals from the electric field sensor;
(c) a signal conditioning circuit adapted to process the amplified electric signals and form time-coordinated, distinct source type identifier signals, the identifier signals including neutral-earth (NEV) contact voltage source, intermittent arcing condition fault source, and induced contact voltage source; and
(d) a signal processor adapted to evaluate the time-coordinated signals and provide a user with a source identification of a contact voltage source by activating an appropriate light emitting diode (LED) indicator representative of one of the time-coordinated, distinct source type identifier signals.

* * * * *